US005535284A

United States Patent [19]

Thornhill et al.

[11] Patent Number: 5,535,284

[45] Date of Patent: Jul. 9, 1996

[54] WOOFER SPEAKER AND ACOUSTICALLY COUPLED SUB-WOOFER SPEAKER SYSTEM

[76] Inventors: James A. Thornhill; Charlotte Thornhill, both of 2112 S. Beacon St., Muncie, Ind. 47302

[21] Appl. No.: 285,274

[22] Filed: Aug. 3, 1994

[51] Int. Cl.$^6$ .......... H05K 5/00

[52] U.S. Cl. .......... 381/154; 381/159

[58] Field of Search .......... 381/153–154, 381/87–90, 24, 159; 181/153, 160, 196–197

[56] References Cited

U.S. PATENT DOCUMENTS

| | | | |
|---|---|---|---|
| D. 273,583 | 4/1984 | Hattori | D14/219 |
| D. 319,239 | 8/1991 | Kovner | D14/204 |
| 4,807,293 | 2/1989 | Weckler | 381/159 |
| 4,930,596 | 6/1990 | Saiki et al. | 381/154 |
| 5,147,986 | 9/1992 | Cockrum et al. | 181/145 |
| 5,170,436 | 12/1992 | Powell | 381/90 |
| 5,191,177 | 3/1993 | Chi | 181/153 |
| 5,406,637 | 4/1995 | Gonzalez et al. | 381/154 |

FOREIGN PATENT DOCUMENTS

| | | | |
|---|---|---|---|
| 0314078 | 12/1988 | Japan | 381/153 |
| 0068099 | 3/1989 | Japan | 381/154 |
| 6253383 | 9/1994 | Japan | 381/154 |
| 641718 | 8/1950 | United Kingdom | 381/159 |

*Primary Examiner*—Stephen Brinich

[57] ABSTRACT

Provided is a woofer speaker and acoustically coupled sub-woofer speaker system. Such system is comprised of a tubular enclosure and has a lower elbow. The lower elbow has an open lower end facing sideward, an open upper end facing upward and a bend therebetween. Further included in the system is an upper elbow with an open lower end facing downward, an open upper end facing sideward and a bend therebetween. An extension tube is coupled between the upper end of the lower elbow and the lower end of the upper elbow to define a transmission channel. A woofer speaker is coupled to the lower end of the lower elbow and is adapted to be electrically energized for projecting sound therefrom. Finally, a holding mechanism is provided for allowing the tubular enclosure to be supported in a fixed orientation. The system is constructed so that when the woofer speaker is electrically energized, back propagated audible sounds are acoustically coupled through the transmission channel and projected from the upper end of the upper elbow in phase with those of the woofer speaker. This creates a sub-woofer speaker.

2 Claims, 4 Drawing Sheets

Fig. 6
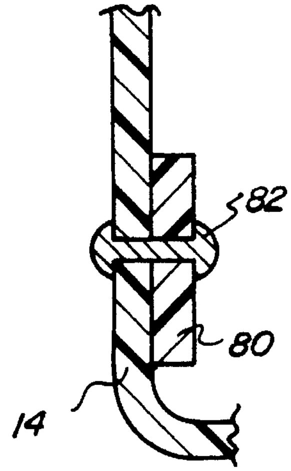
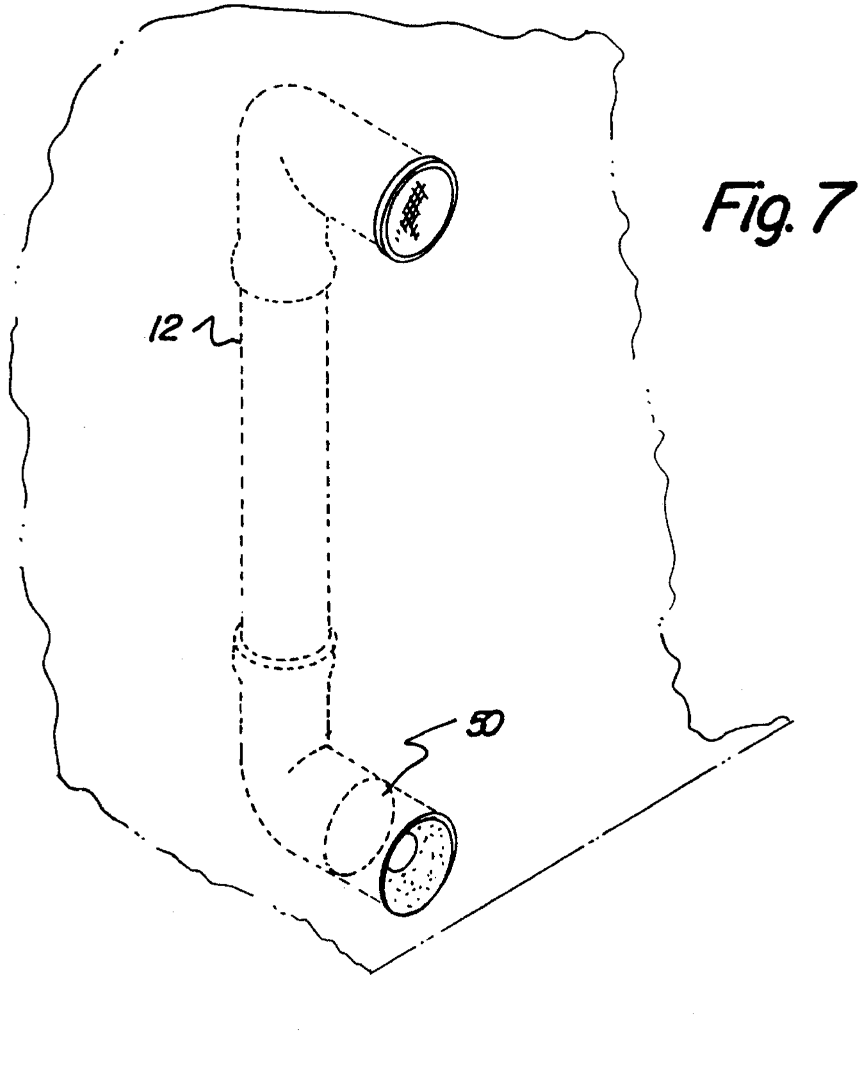
Fig. 7

WOOFER SPEAKER AND ACOUSTICALLY COUPLED SUB-WOOFER SPEAKER SYSTEM

BACKGROUND OF THE INVENTION

1. Field of the Invention

The present invention relates to a woofer speaker and acoustically coupled sub-woofer speaker system and more particularly pertains to transmitting audible low frequency acoustic energy with a woofer speaker and acoustically coupled sub-woofer speaker system.

2. Description of the Prior Art

The use of sub-woofer speaker systems is known in the prior art. More specifically, sub-woofer speaker systems heretofore devised and utilized for the purpose of providing acoustic energy are known to consist basically of familiar, expected and obvious structural configurations, notwithstanding the myriad of designs encompassed by the crowded prior art which have been developed for the fulfillment of countless objectives and requirements.

By way of example, U.S. Pat. No. 273,583 to Hattori discloses a speaker enclosure. U.S. Pat. No. 319,239 to Kovner discloses a speaker enclosure. U.S. Pat. No. 5,147,986 to Cockrum et al. discloses a subwoofer speaker system. U.S. Pat. No. 5,170,436 to Powell discloses an acoustic speaker system. U.S. Pat. No. 5,191,177 to Chi discloses a tube speaker.

While these devices fulfill their respective, particular objective and requirements, the aforementioned patents do not describe a woofer speaker and acoustically coupled sub-woofer speaker system that is simple in design and uses a tubular enclosure for creating a sub-woofer speaker.

In this respect, the woofer speaker and acoustically coupled sub-woofer speaker system according to the present invention substantially departs from the conventional concepts and designs of the prior art, and in doing so provides an apparatus primarily developed for the purpose of transmitting audible low frequency acoustic energy.

Therefore, it can be appreciated that there exists a continuing need for new and improved woofer speaker and acoustically coupled sub-woofer speaker system which can be used for transmitting audible low frequency acoustic energy. In this regard, the present invention substantially fulfills this need.

SUMMARY OF THE INVENTION

In the view of the foregoing disadvantages inherent in the known types of sub-woofer speaker systems now present in the prior art, the present invention provides an improved woofer speaker and acoustically coupled sub-woofer speaker system. As such, the general purpose of the present invention, which will be described subsequently in greater detail, is to provide a new and improved woofer speaker and acoustically coupled sub-woofer speaker system and method which has all the advantages of the prior art and none of the disadvantages.

To attain this, the present invention essentially comprises, in combination, a tubular enclosure with a diameter between about 6 inches to 15 inches. The tubular enclosure includes a lower elbow with an open lower end facing sideward, an open and beveled upper end facing upward, and a generally perpendicular bend therebetween, an upper elbow with an open and beveled lower end facing downward, an open upper end facing sideward in the same direction as the lower end of the lower elbow, and a generally perpendicular bend therebetween, and a linear extension tube with an open lower end frictionally and removably coupled within the upper end of the lower elbow and an open upper end frictionally and removably coupled within the lower end of the upper elbow to define a transmission channel with the distance between the centroid of the lower end of the lower elbow and the centroid of the upper end of the upper elbow being between about 6 feet to 11 feet. A woofer speaker is included and coupled to the lower end of the lower elbow and adapted to be electrically energized for projecting a low frequency sound therefrom. A barrier screen is included and formed of a sound-penetrable material coupled across the transmission channel between the upper end of the lower elbow and the woofer speaker. A polyester fiber material is included and packed in the transmission channel between the barrier screen and the upper end of the upper elbow. A grill formed of a sound-penetrable material is included and coupled across the transmission channel at the upper end of the upper elbow for containing the fiber material within the transmission channel. Lastly, a rigid and cube-shaped stand having a horizontal and rectangular upper frame positioned directly above the lower elbow between the lower end and the bend thereof, a horizontal and rectangular lower frame positioned directly below the lower elbow and aligned with the upper frame, and four vertical side legs each coupled between a separate corner of the upper frame and a separate corner of the lower frame, the stand thereby allowing the tubular enclosure to be supported upon an external surface with the upper end of the upper elbow positioned directly above the lower end of the lower elbow. When the woofer speaker is electrically energized at its terminal and emits audible sounds between about 20 Hz and about 30 Hz, audible sounds are back-propagated, acoustically coupled through the transmission channel and fiber material, and then projected from the grill in phase with those of the woofer speaker, thereby creating a sub-woofer speaker.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved woofer speaker and acoustically coupled sub-woofer speaker system which has all the advantages of the prior art sub-woofer speaker systems and none of the disadvantages.

It is another object of the present invention to provide a new and improved woofer speaker and acoustically coupled sub-woofer speaker system which may be easily and efficiently manufactured and marketed.

It is a further object of the present invention to provide a new and improved woofer speaker and acoustically coupled sub-woofer speaker system which is of durable and reliable construction.

An even further object of the present invention is to provide a new and improved woofer speaker and acoustically coupled sub-woofer speaker system which is susceptible of a low cost of manufacture with regard to both materials and labor, and which accordingly is then susceptible of low prices of sale to the consuming public, thereby making such a woofer speaker and acoustically coupled sub-woofer speaker system economically available to the buying public.

Still yet another object of the present invention is to provide a new and improved woofer speaker and acoustically coupled sub-woofer speaker system which provides in the apparatuses and methods of the prior art some of the advantages thereof, while simultaneously overcoming some of the disadvantages normally associated therewith.

Even still another object of the present invention is to provide a new and improved woofer speaker and acoustically coupled sub-woofer speaker system for transmitting audible low frequency acoustic energy.

Lastly, it is an object of the present invention to provide a new and improved woofer speaker and acoustically coupled sub-woofer speaker system comprising a tubular enclosure having a lower elbow with an open lower end facing sideward, an open upper end facing upward, and a bend therebetween, an upper elbow with an open lower end facing downward, an open upper end facing sideward, and a bend therebetween, and an extension tube coupled between the upper end of the lower elbow and the lower end of the upper elbow to define a transmission channel; a woofer speaker coupled to the lower end of the lower elbow and adapted to be electrically energized for projecting sound therefrom; and holding means for allowing the tubular enclosure to be supported in a fixed orientation; whereby when the woofer speaker is electrically energized, back-propagated audible sounds are acoustically coupled through the transmission channel and projected from the upper end of the upper elbow in phase with those of the woofer speaker, thereby creating a sub-woofer speaker.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 6 is a cross-sectional view of the coupling between the lower elbow and stand taken along the line 6—6 of FIG. 5.

FIG. 7 is a perspective view of an alternate embodiment of the present invention secured within a wall.

The same reference numerals refer to the same parts through the various Figures.

DESCRIPTION OF THE PREFERRED EMBODIMENT

Figure 1:
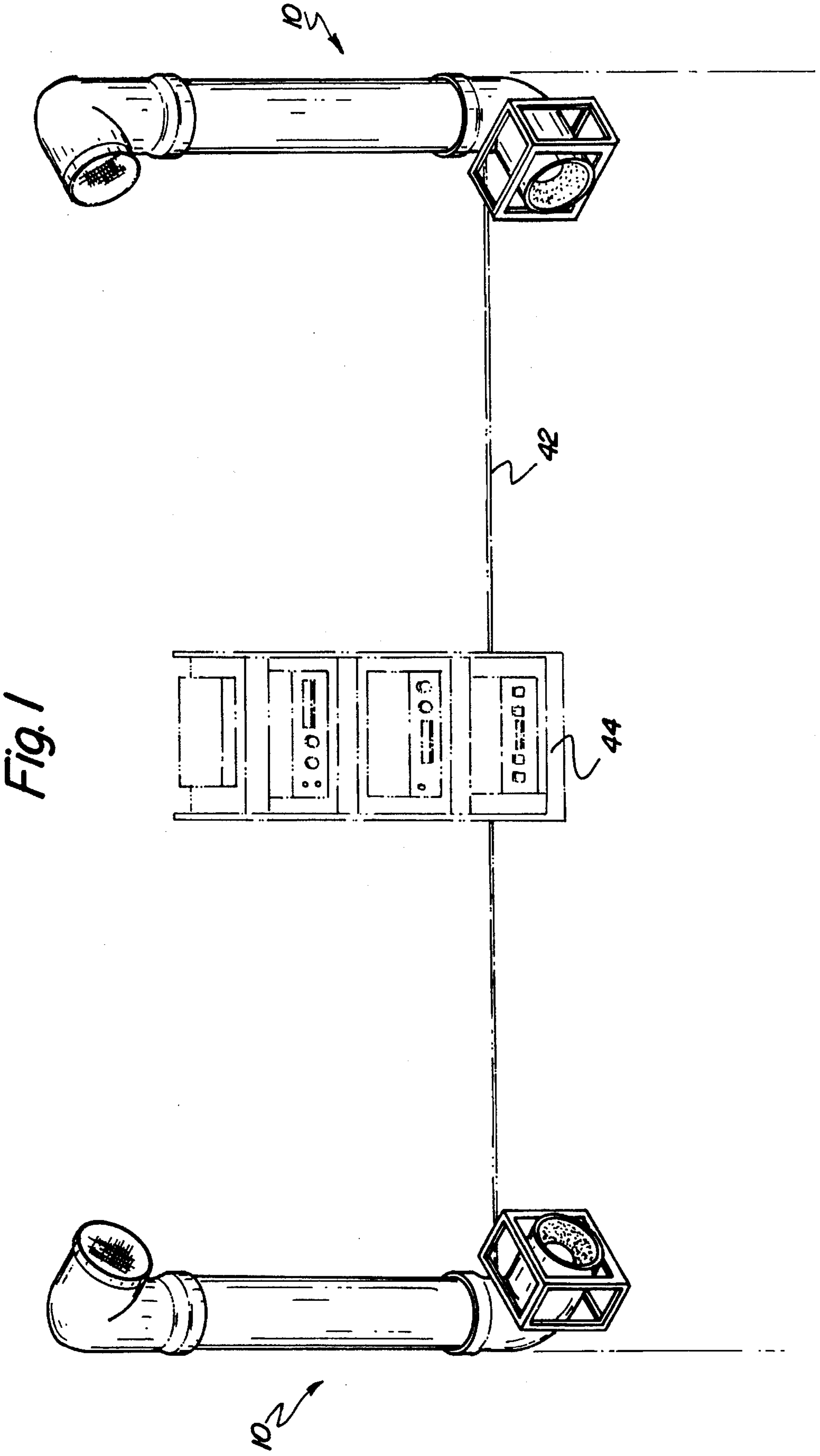
FIG. 1 is a perspective view of the preferred embodiment of the woofer speaker and acoustically coupled sub-woofer speaker system constructed in accordance with the principles of the present invention.
Figure 2:
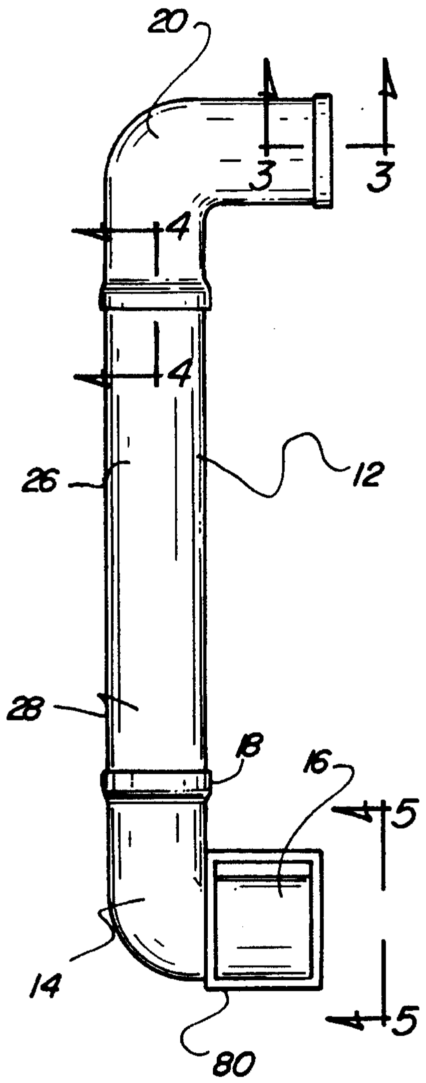
FIG. 2 is a side-elevational view of the present invention as depicted in FIG. 1.
Figure 3:
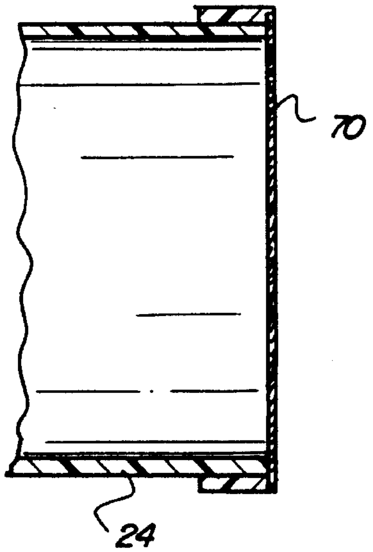
FIG. 3 is an enlarged cross-sectional view of the coupling between the upper end of the upper elbow and the grill taken along the line 3—3 of FIG. 2.
Figure 4:
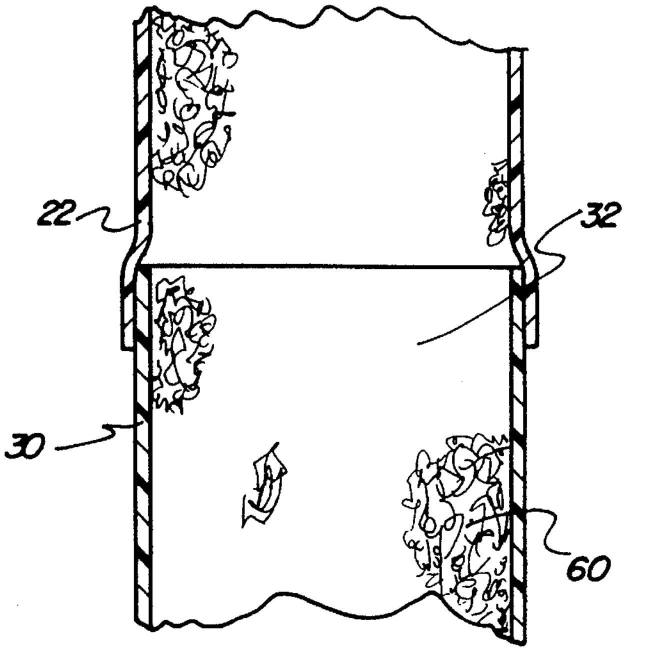
FIG. 4 is a cross-sectional view of the coupling between the upper elbow and extension tube taken along the line 4—4 of FIG. 2.
Figure 5:
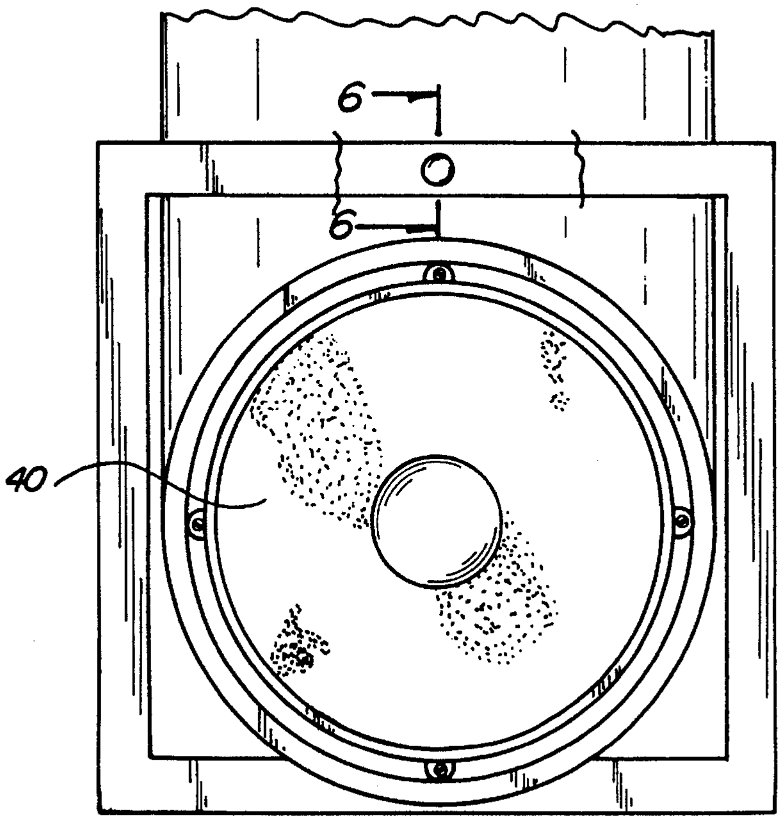
FIG. 5 is a view of the coupling between the lower elbow, woofer speaker, and stand taken along the line 5—5 of FIG. 2.

With reference now to the drawings, and in particular, to FIG. 1 thereof, the preferred embodiment of the new and improved woofer speaker and acoustically coupled sub-woofer speaker system embodying the principles and concepts of the present invention and generally designated by the reference number 10 will be described.

Specifically, the present invention includes six major components. The major components are the tubular enclosure, woofer speaker, barrier screen, fiber material, grill and stand. These components are interrelated to provide the intended function.

More specifically, it will be noted in the various Figures that the first major component is the tubular enclosure 12. The tubular enclosure is formed of a plastic or other rigid material. It has a diameter between about 6 inches to 15 inches, depending upon the diameter of each woofer speaker utilized. The tubular enclosure has a lower elbow 14. The lower elbow has an open lower end 16 facing sideward. The lower elbow also has an open and beveled upper end 18 facing upward. A generally perpendicular bend is formed between the lower end and the upper end of the lower elbow. The enclosure also includes an upper elbow 20. The upper elbow has an open and beveled lower end 22 facing downward. The upper elbow also has an open upper end 24 facing sideward in the same direction as the lower end 16 of the lower elbow. The upper elbow also includes a generally perpendicular bend between its upper end and lower end. The tubular enclosure also includes a linear extension tube 26. The linear extension tube has an open lower end 28 frictionally and removably coupled within the upper end of the lower elbow. The linear extension tube also has an open upper end 30 frictionally and removably coupled within the lower end of the upper elbow. The coupling of the elbows with the extension tube defines a transmission channel 32 through the tubular enclosure. Both the lower end of the lower elbow and the upper end of the upper elbow are defined to have a centroid. The tubular enclosure is formed such that the distance between the centroid of the lower end of the lower elbow and the centroid of the upper end of the upper elbow is between about 6 feet to about 11 feet. However, this distance is not critical to operation and may be set as desired. The tubular enclosure is adapted for projecting low frequency audible sound therethrough from the lower elbow to the upper elbow.

The second major component is the woofer speaker 40. The woofer speaker has a diameter between about 6 inches to 15 inches. The diameter of the woofer speaker drives the selection of the diameter of the tubular enclosure. The woofer speaker is coupled to the lower end 16 of the lower elbow. The speaker has a membrane portion projected outwards from the lower end of the lower elbow and a terminal portion projected inwards within the lower elbow. The woofer speaker is adapted to be electrically energized through the integral terminal for projecting low frequency audible sounds. The woofer speaker is electrically energized through a wire 42 extended through the tubular enclosure and coupled to the terminals of the speaker. The wire could be extended through the tubular enclosure itself or extended through one of the frictional coupling points of the extension tube with one of the elbows. The wire transmits electrical power from an amplifier 44 of a stereo.

The third major component is the barrier screen 50. The barrier screen is formed of a sound penetrable material such as cloth or wire screen. It is coupled across the transmission channel 32 between the upper end of the lower elbow 18 and the woofer speaker 40. It is adapted for preventing material thereabove from contacting the speaker or its terminal.

The fourth major component is the fiber material 60. The fiber material is formed of polyester. The fiber material is packed in the transmission channel 32 between the barrier screen 50 and the upper end 24 of the upper elbow. The fiber material serves as a transmission medium for assisting in the projection of low frequency audible sound through the transmission channel towards the upper elbow. The fiber material also dampens any possible resonance generated and attentuates all high frequencies.

The fifth major component is the grill 70. The grill is formed of a sound penetrable material such as decorative metal screen. It is coupled across the transmission channel 32 at the upper end 24 of the upper elbow. The grill is used for containing the fiber material 16 within the transmission channel. It is also adapted for preventing extraneous materials from entering the transmission channel.

The sixth major component is the stand 80. The stand is rigid and cube-shaped in structure. It has a horizontal and rectangular upper frame positioned directly above the lower elbow between the lower end 16 and the bend thereof. The stand also includes a horizontal and rectangular lower frame positioned directly below the lower elbow 14 and aligned with the upper frame. Four vertical side legs are included. Each side leg is coupled between a separate corner of the upper frame and a separate corner of the lower frame. This configuration defines the structure of the stand. The stand is thereby able to support the tubular enclosure upon an external surface with the upper end 24 of the upper elbow positioned directly above the lower end 16 of the lower elbow. The upper frame is coupled to the lower elbow 14 through the use of a rivet 82. The amplifier 44 of the stereo system may also be supported upon the stand.

When the woofer speaker 40 is electrically energized at its terminal, it emits audible frequency sounds in between the range of about 20 Hz to 30 Hz. These audible sounds are forwardly propagated as well as back propagated through the tubular enclosure. When audible sounds are back propagated through the tubular enclosure, they are acoustically coupled through the transmission channel 32 and fiber material 60. These low frequency audible sounds are then projected from the grill 70. The audible sounds projected from the grill are in phase with those sounds forwardly projected through the woofer speaker itself. Thus, a sub-woofer speaker is created. The sub-woofer speaker in combination with the woofer speaker produces low frequency audible sounds having more depth and accuracy than those that would be produced with the woofer speaker itself. The sub-woofer speaker thereby enhances low frequency sounds in music for the pleasure of a listener. Furthermore, the sub-woofer speaker system yields no false bass due to the low frequency enhancement.

A second embodiment of the present invention includes substantially all of the components of the preferred embodiment except the stand. Instead of the stand, a holding mechanism is used for securing the system within a wall as shown in FIG. 7. The woofer speaker and grill are projected from the wall for providing audible low frequency sounds. In this configuration, floor space is not needed to support the invention. This allows the present invention to be used in rooms where space is a premium. It also places the present invention in a position such that it may not be damaged.

The present invention is a true transmission line for use in conjunction with general or high-frequency audio speakers. The present invention features cylindrical rear loading as opposed to the conventional rectangular box loading as used with typical box-type transmission line speakers. At frequencies between about 20–30 Hz, the upper end of the tubular enclosure emits the sound in phase with the lower speaker driver frontal sound. The present invention can be built either vertically or horizontally into a wall of a new room or house, with only the openings thereof projected into the room. One system can be used as a single sub-woofer or two systems can be used in a normal stereo configuration. The frequencies ranging from about 100 Hz to 20 KHz can be handled by a small complementary speakers of the individual's choice (one/channel). The three sections of plastic pipe are friction fit so they can be slipped apart for shipping and re-assembled easily. Preferably, the "DACRON" polyester fiber is used as filler within the transmission channel. Approximately ½ pound per cubic foot of "DACRON" is packed within the tubular enclosure. The two speakers of the present invention are connected in a normal fashion with a stereo system. The wiring for energizing the speakers is routed through plastic piping. Because of the synchronous phasing generated through the tubular enclosure, audible sound transmission is essentially distortion free. The present invention can be unobtrusively installed within a room with only the two grills for the speakers in view.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and the manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modification and changes will readily occur to those skilled in the art, it is not desired to limit the invention to the exact construction and operation shown and described, and accordingly, all suitable modification and equivalents may be resorted to, falling within the scope of the invention.

What is claimed as being new and desired to be protected by Letters Patent of the United States is as follows:

1. A woofer speaker and acoustically coupled sub-woofer speaker system for transmitting audible low frequency acoustic energy comprising, in combination:

a tubular enclosure with a diameter between about 6 inches to 15 inches, the tubular enclosure having a lower elbow with an open lower end facing sideward, an open and beveled upper end facing upward, and a generally perpendicular bend therebetween, an upper elbow with an open and beveled lower end facing downward, an open upper end facing sideward in the same direction as the lower end of the lower elbow, and a generally perpendicular bend therebetween, and a linear extension tube with an open lower end frictionally and removably coupled within the upper end of the lower elbow and an open upper end frictionally and removably coupled within the lower end of the upper elbow to define a transmission channel with the distance between the centroid of the lower end of the lower elbow and the centroid of the upper end of the upper elbow is between about 6 feet to 11 feet;

a woofer speaker with a diameter between about 6 inches to 15 inches coupled to the lower end of the lower elbow and comprising means for allowing the woofer speaker to be electrically energized for projecting a low frequency sound therefrom;

a barrier screen formed of a sound-penetrable material coupled across the transmission channel between the upper end of the lower elbow and the woofer speaker;

a polyester fiber material in an amount of ½ pound per cubic foot packed in the transmission channel between the barrier screen and the upper end of the upper elbow;

a grill formed of a sound-penetrable material coupled across the transmission channel at the upper end of the upper elbow for containing the fiber material within the transmission channel; and a rigid and cube-shaped stand having a horizontal and rectangular upper frame positioned directly above the lower elbow between the lower end and the bend thereof, a horizontal and rectangular lower frame positioned directly below the lower elbow and aligned with the upper frame, and four vertical side legs each coupled between a separate corner of the upper frame and a separate corner of the lower frame, the stand thereby allowing the tubular enclosure to be supported upon an external surface with the upper end of the upper elbow positioned directly above the lower end of the lower elbow;

whereby when the woofer speaker is electrically energized at its terminal and emits audible sounds between about 20 Hz and about 30 Hz, audible sounds are back-propagated, acoustically coupled through the transmission channel and fiber material, and then projected from the grill in phase with those of the woofer speaker, thereby creating a sub-woofer speaker.

2. A woofer speaker and acoustically coupled sub-woofer speaker system comprising:

a tubular enclosure having a lower elbow with an open lower end facing sideward, an open upper end facing upward, and a bend therebetween, an upper elbow with an open lower end facing downward, an open upper end facing sideward, and a bend therebetween, and an extension tube coupled between the upper end of the lower elbow and the lower end of the upper elbow to define a transmission channel;

a woofer speaker coupled to the lower end of the lower elbow and adapted to be electrically energized for projecting sound therefrom;

a barrier screen formed of a sound-penetrable mesh material coupled across the transmission channel between the upper end of the lower elbow and the woofer speaker;

a polyester fiber material for transmitting audible sound packed in the transmission channel between the barrier screen and the upper end of the upper elbow;

a grill formed of a sound-penetrable mesh material coupled across the transmission channel at the upper end of the upper elbow for containing the fiber material within the transmission channel;

holding means for allowing the tubular enclosure to be supported in a fixed orientation;

whereby when the woofer speaker is electrically energized, back-propagated audible sounds are acoustically coupled through the transmission channel and projected from the upper end of the upper elbow in phase with those of the woofer speaker, thereby creating a sub-woofer speaker.

* * * * *